United States Patent
Pickerd et al.

(10) Patent No.: US 9,772,391 B2
(45) Date of Patent: Sep. 26, 2017

(54) METHOD FOR PROBE EQUALIZATION

(71) Applicant: Tektronix, Inc., Beaverton, OR (US)

(72) Inventors: John J. Pickerd, Hillsboro, OR (US); William A. Hagerup, Portland, OR (US); William Q. Law, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 14/164,016

(22) Filed: Jan. 24, 2014

(65) Prior Publication Data
US 2015/0212185 A1    Jul. 30, 2015

(51) Int. Cl.
*G01R 27/26* (2006.01)
*G01R 35/00* (2006.01)
*G01R 1/067* (2006.01)
*G01R 13/02* (2006.01)

(52) U.S. Cl.
CPC ............ *G01R 35/00* (2013.01); *G01R 1/067* (2013.01); *G01R 13/029* (2013.01); *G01R 35/005* (2013.01)

(58) Field of Classification Search
CPC ............ G01R 35/005; G01R 31/3191; H04M 3/5175; H04M 3/493
USPC .............. 324/755.07, 750.02, 437, 445, 446, 324/754.03, 754.21
See application file for complete search history.

(56) References Cited

U.S. PATENT DOCUMENTS

| | | | | |
|---|---|---|---|---|
| 4,899,106 A | * | 2/1990 | Ogura ................ | G01R 1/07364 324/754.18 |
| 4,998,026 A | * | 3/1991 | King .................... | H03K 17/667 324/523 |
| 5,012,186 A | * | 4/1991 | Gleason ............. | G01R 1/06705 324/72.5 |
| 5,213,876 A | * | 5/1993 | Smyth, Jr. ............... | H05K 1/162 219/121.69 |
| 5,264,788 A | * | 11/1993 | Smith ...................... | G01R 1/06 324/72.5 |
| 5,519,327 A | * | 5/1996 | Consiglio ............ | G01R 31/002 324/602 |

(Continued)

OTHER PUBLICATIONS

Agilent Technologies, "Emphasis, Equalization & Embedding 'Cleaning the Rusty Channel,'" undated, 53 pages.

(Continued)

*Primary Examiner* — Patrick Assouad
*Assistant Examiner* — Taqi Nasir
(74) *Attorney, Agent, or Firm* — Marger Johnson; Andrew J. Harrington (57) ABSTRACT

A test and measurement system including a test and measurement instrument, a probe connected to the test and measurement instrument, a device under test connected to the probe, at least one memory configured to store parameters for characterizing the probe, a user interface and a processor. The user interface is configured to receive a nominal source impedance of the device under test. The processor is configured to receive the parameters for characterizing the probe from the memory and the nominal source impedance of the device under test from the user interface and to calculate an equalization filter using the parameters for characterizing the probe and nominal source impedance from the user interface.

15 Claims, 7 Drawing Sheets

(56) References Cited

U.S. PATENT DOCUMENTS

| | | | |
|---|---|---|---|
| 5,804,977 A * | 9/1998 | Consiglio | G01R 31/002 |
| | | | 324/676 |
| 6,087,841 A * | 7/2000 | Bonaccio | G01R 31/043 |
| | | | 324/538 |
| 6,725,170 B1 | 4/2004 | Hickman | |
| 7,405,575 B2 | 7/2008 | Tan et al. | |
| 7,865,319 B1 | 1/2011 | Jacobs et al. | |
| 7,994,801 B2 | 8/2011 | Hagerup et al. | |
| 8,170,820 B2 | 5/2012 | Pupalaikis et al. | |
| 2005/0185769 A1* | 8/2005 | Pickerd | G01R 35/005 |
| | | | 379/30 |
| 2008/0048677 A1 | 2/2008 | Tan | |
| 2008/0278176 A1 | 11/2008 | Hagerup | |
| 2012/0109568 A1* | 5/2012 | M | G06F 11/24 |
| | | | 702/124 |

OTHER PUBLICATIONS

European Search Report and Written Opinion for Application No. 151519913, dated Dec. 23, 2015, 7 pages.

* cited by examiner

METHOD FOR PROBE EQUALIZATION

TECHNICAL FIELD

This disclosure relates generally to signal acquisition systems and, more particularly, to a system, apparatus and method for reducing measurement errors due to, for example, probe tip loading of a device under test.

BACKGROUND

Typical probes used for signal acquisition and analysis devices such as oscilloscopes and the like have an impedance associated with them which varies with frequency. As the bandwidth of test and measurement instruments and probe system become wider the effects of probe tip loading of non-flat through responses becomes more significant than in past systems.

U.S. Pat. No. 6,725,170 entitled "Smart probe apparatus and method for automatic self-adjustment of an oscilloscope's bandwidth" to Barton Hickman, owned by Tektronix, Inc. and incorporated herein by reference, discloses storing S-parameters of a probe so that equalization filters can be computed when a probe is connected to different input channels of different types of test and measurement instruments. These equalization filters, however, are designed for device under test (DUT) source impedance of 50 ohms. What is needed is an equalization filter that can be calculated using the nominal source impedance of the DUT. Using the prior methods, if the source impedance of the DUT is not 50 ohms, then the acquired waveform received via a probe loading such a circuit may not accurately represent the voltage of the circuit prior to the introduction of the probe.

SUMMARY

Certain embodiments of the disclosed technology include a test and measurement system including a test and measurement instrument, a probe connected to the test and measurement instrument, a device under test connected to the probe, at least one memory configured to store parameters for characterizing the probe, a user interface and a processor. The user interface is configured to receive a nominal source impedance of the device under test. The processor is configured to receive the parameters for characterizing the probe from the memory and the nominal source impedance of the device under test from the user interface and to calculate an equalization filter using the parameters for characterizing the probe and nominal source impedance. The equalization filter is adapted to compensate for loading of the device under test caused by a measurement of the device under test.

Certain other embodiments of the disclosed technology include a method for calculating an equalization filter for use in a test and measurement system. The method includes receiving at a processor parameters for characterizing a probe of a test and measurement system, receiving at the processor via a user interface a nominal source impedance of a device under test, and computing an equalization filter adapted to compensate for loading of a device under test caused by measurement of the device under test based on the parameters for characterizing the probe and the nominal source impedance of the device under test.

DETAILED DESCRIPTION

In the drawings, which are not necessarily to scale, like or corresponding elements of the disclosed systems and methods are denoted by the same reference numerals.

Figure 1:
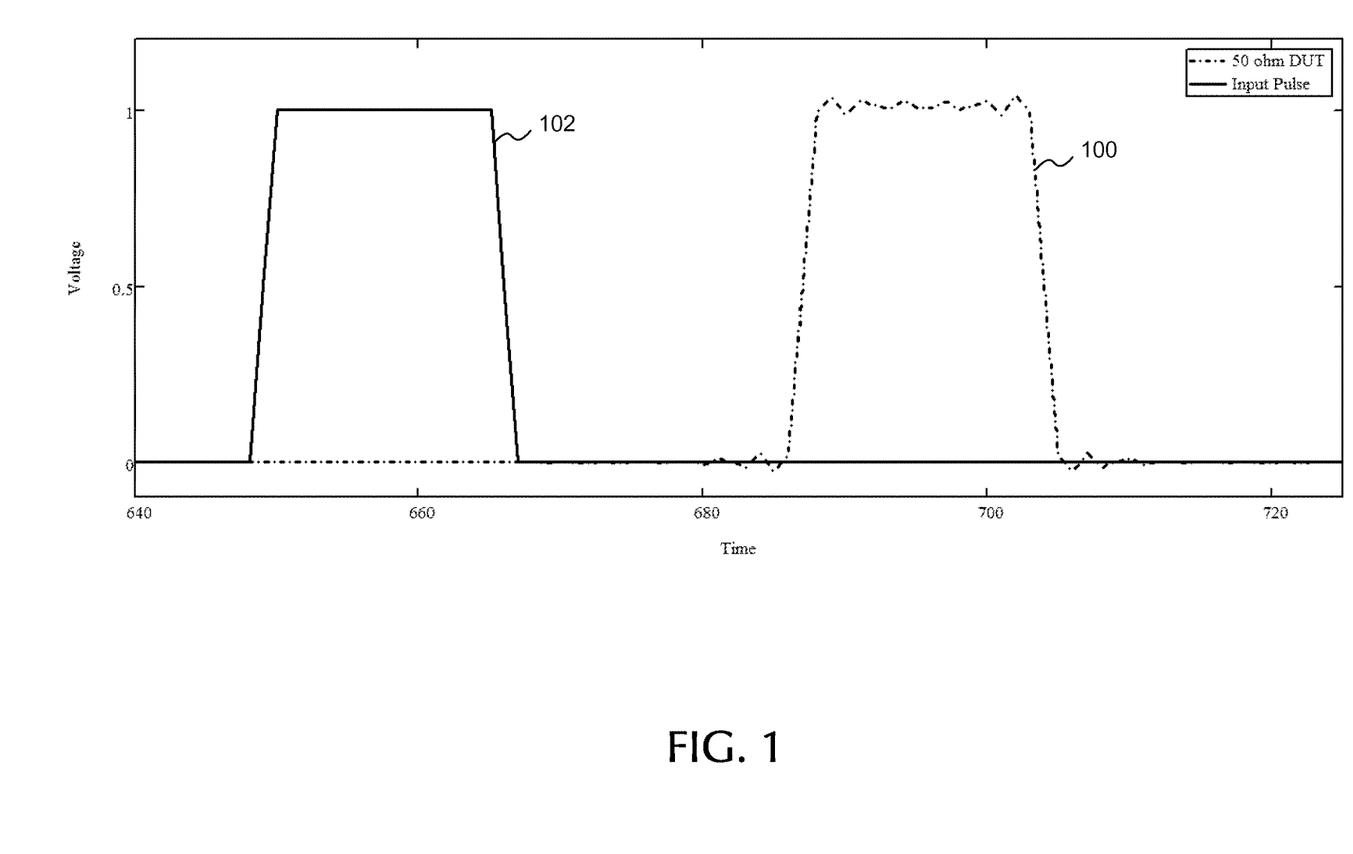
FIG. 1 illustrates an ideal input waveform and the output waveform using a DUT with a 50 ohm source impedance loading the tip of the probe.

Traditional accessories for test and measurement instruments are designed so that an accessory's optimal frequency response occurs when the tip of the accessory is connected to a circuit under test in a DUT with a source impedance of 50 ohms. Accessories tend to load the circuit under test in the DUT, which then distorts the waveform read from the circuit in the DUT. Conventionally, an accessory will incorporate hardware equalization to correct an output wave-shape to look more like it did before the accessory loaded the circuit. An equalization filter is calculated and used to process the acquired samples from the DUT such that signal degradation or artifacts imparted to the waveform read from the circuit under test and in the DUT are compensated for within the system, effectively de-embedding the loading of the DUT by the probe tip. FIG. 1 shows an output 100 response of a test and measurement instrument using the conventional approach given an ideal input pulse 102. As can be seen in FIG. 1, the output 100 shows some distortion.

Figure 2:
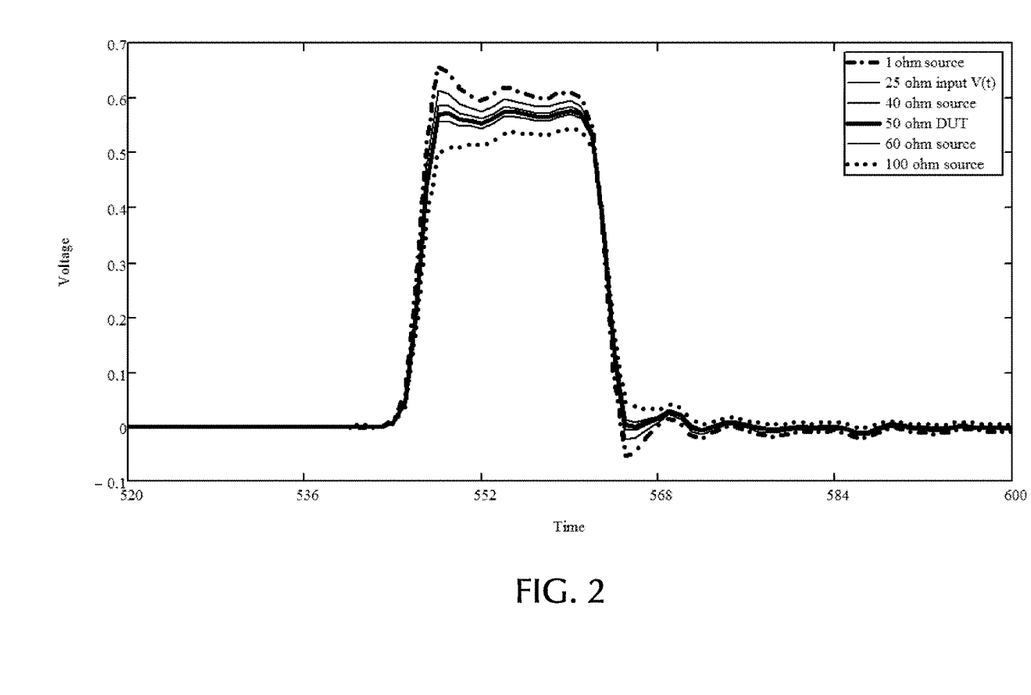
FIG. 2 illustrates the ideal input waveform of the FIG. 1 and output waveforms with varying DUT source impedance values.

A DUT source impedance, however, tends to fall in the range of 25 ohms to 100 ohms. The DUT source impedance tends to vary over that range even if the DUT is specified to have a source impedance of 50 ohms. FIG. 2 shows in the conventional method how the outputs vary from the ideal input 102 shown in FIG. 1 when the source impedance of the DUT is not 50 ohms. As can be seen in FIG. 2, the errors in the output waveforms can be quite large.

The errors seen in FIG. 2 can be reduced by allowing a user to specify the nominal source impedance of the DUT to calculate an equalization filter.

Figure 3:
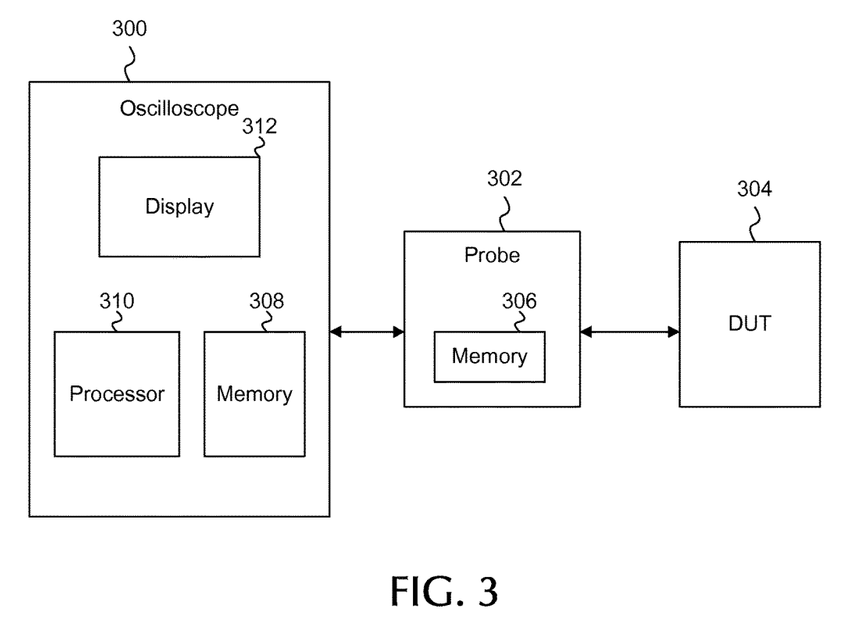
FIG. 3 illustrates a block diagram of a test and measurement system of the disclosed technology.

As seen in FIG. 3, the system includes a test and measurement instrument 300 and a probe 302 connected to a DUT 304. The test and measurement instrument 300, may be for example, an oscilloscope. The test and measurement instrument may also be any other test and measurement instrument, such as a spectrum analyzer, logic analyzer, etc.

The probe 302 includes a memory 306 for storing the S-parameters of the probe. Alternatively, the T-parameters or some other form of parameters to characterize the probe may be stored in the memory 306. The parameters are measured at the time of manufacturing the probe 302 and then stored in memory 306. Alternatively, the parameters may be stored in a memory 308 of the test and measurement instrument 300, or on an external storage device (not shown), the internet (not shown), etc. The parameters merely must be supplied to the processor 310 to calculate the equalization filter as will be discussed in more detail below.

The test and measurement instrument 300 also includes a memory 308, as discussed above. Memory 308 stores the S-parameters of the test and measurement instrument 300 that are measured at the time of manufacturing. Alternatively, T-parameters or other forms of parameters to characterize the scope may be used and stored in memory 308. Along with memory 308, the test and measurement instrument 300 includes a display 312 and a processor 310.

Figure 4:
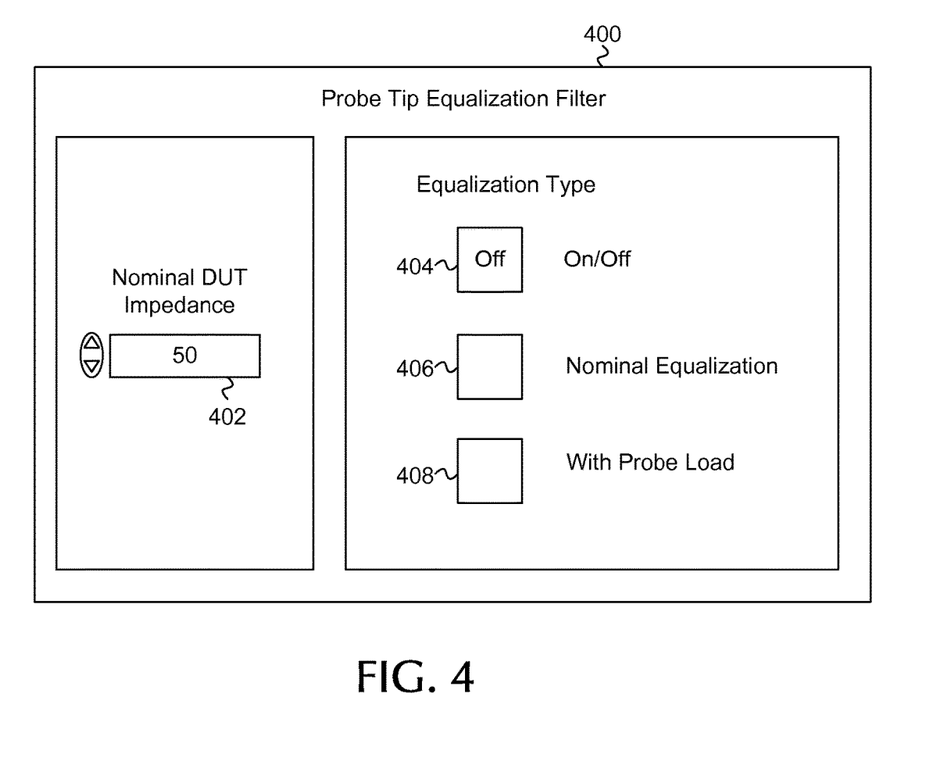
FIG. 4 illustrates a user interface of the disclosed technology.

During operation, the test and measurement instrument 300 is connected to the DUT 304 through the probe 302. The display 312 contains a user menu or user interface 400 as shown in FIG. 4. The user menu 400 allows the user to specify the nominal source impedance of the DUT 402. The user can specify either the real impedance or the complex impedance of the DUT at the menu 402. The nominal source impedance is then used as part of the calculation for the equalization filter to obtain an ideal target response for the system.

The user menu 400 also contains an option for the user to turn the probe equalization filter on or off 404. A user may turn off the equalization filter if the results for a particular DUT are better without the filter. The user menu 400 also allows a user to select whether to use nominal equalization view 406. The nominal equalization view shows the waveform as if the probe did not load the DUT circuit. The user can also select the option of using a probe load filter 408 in the user menu. The probe load filter shows the voltage at the probe tip with the probe loading the DUT circuit.

Figure 5:
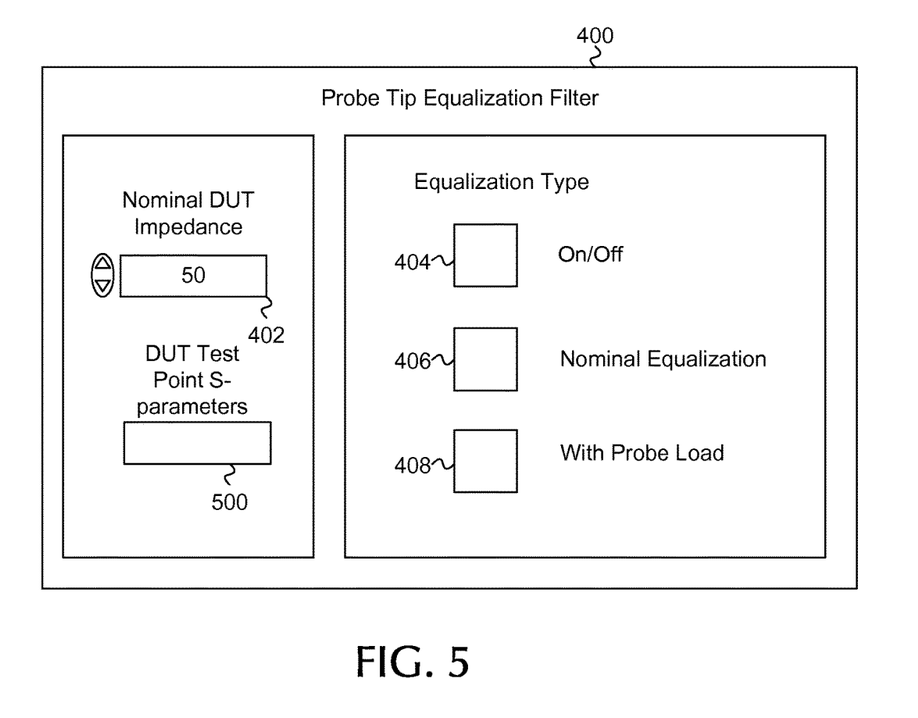
FIG. 5 illustrates another user interface of the disclosed technology.

The user menu 400 may also include a menu 500 to allow a user to load the S-parameters for the DUT test point, as shown in FIG. 5. The equalization filter is then computed using both the nominal impedance of the DUT and the S-parameters for the DUT test point.

When the user has entered all the desired information into the user menu 400 on display 312, the information is sent to processor 312 in the test and measurement instrument 300. Further, the S-parameters of the probe stored in the probe memory 306 are also sent to the processor 310 in the test and measurement instrument 300. The processor then uses the S-parameters of the probe, the nominal impedance of the DUT provided by the user to compute an equalization filter to provide a more accurate view of the signal from the DUT. To provide an even more accurate view, the processor may also use the S-parameters of the test and measurement instrument 300 stored in the test and measurement memory 310 and the S-parameters of the DUT if the S-parameters of the DUT are loaded into the test and measurement instrument 300 by the user via menu 500.

Figure 6:
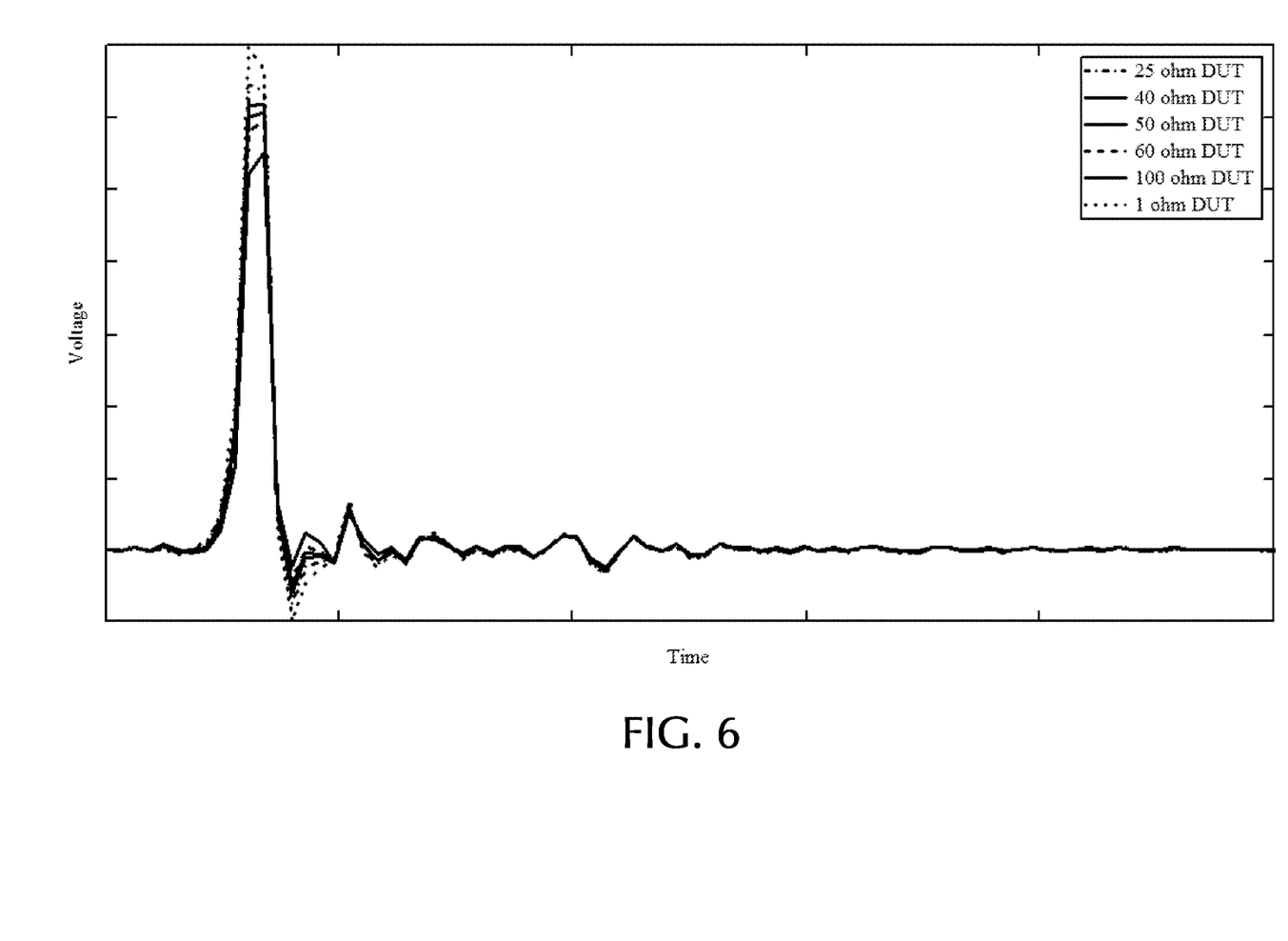
FIG. 6 illustrates a variety of equalization filters calculated using the disclosed technology.

FIG. 6 illustrates the various equalization filters created by the processor 310 for each of the various nominal source impedance values. As can be seen in FIG. 6, the equalization filters are different for each of the nominal source impedance values, which helps create a more accurate view on the display to the user of the signal from the circuit under test in the DUT.

Figure 7:
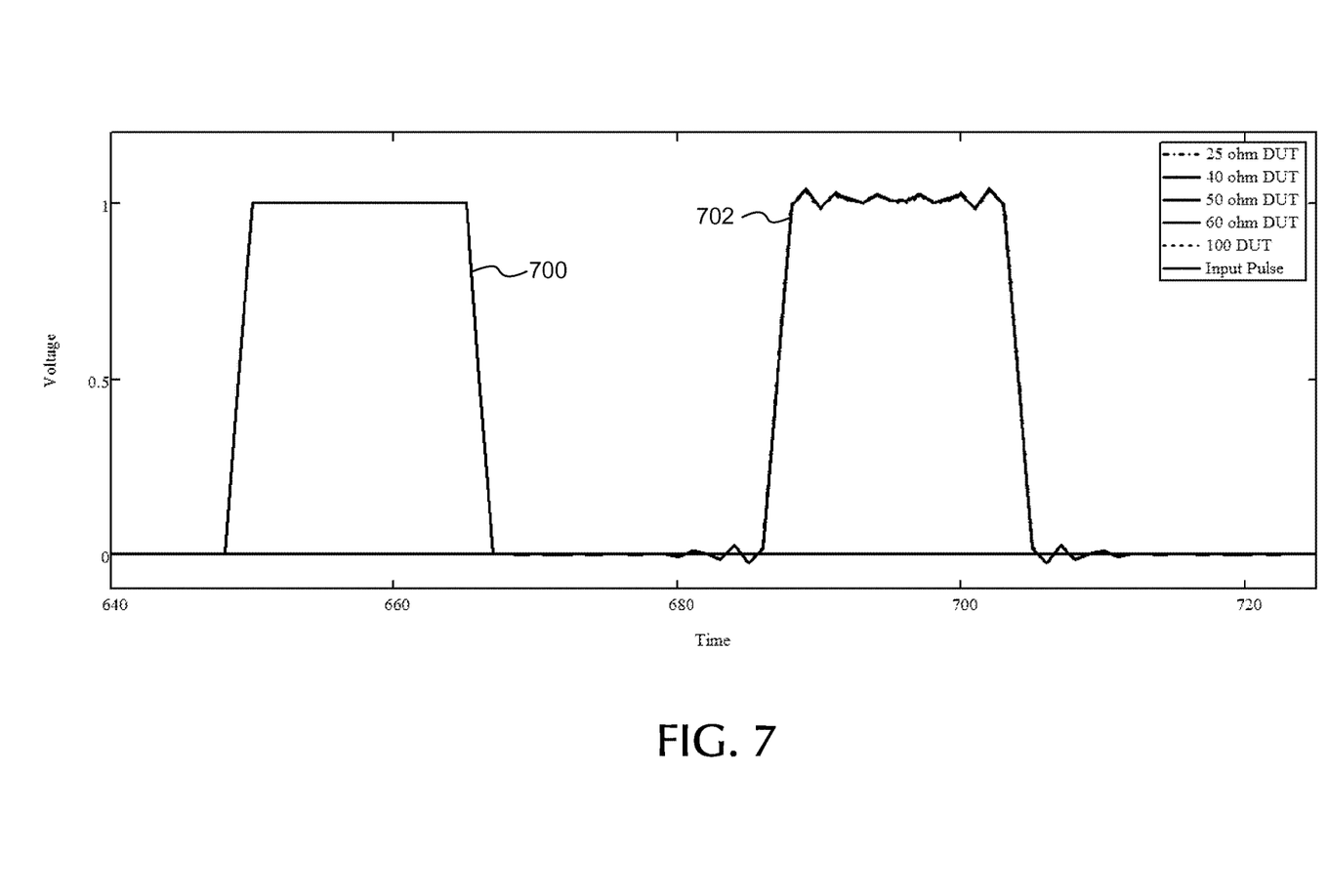
FIG. 7 illustrates an ideal input waveform and various output waveforms using different equalization filters for various DUT source impedance.

FIG. 7 illustrates output waveforms with the equalization filter applied using nominal input impedance values inputted by the user. For example, FIG. 7 shows an input waveform 700 and the output waveforms 702 for multiple DUT source impedance values. As can be seen in FIG. 7, for each of the DUT source impedance values, after applying an equalization filter calculated with the nominal DUT impedance input by the user, the output waveforms are nearly identical to the input waveform, unlike the output waveforms shown in FIG. 2.

The disclosed technology allows a user to control the equalization filter applied to the tip of a probe. The user can specify a DUT source reference impedance at the probe tip and then an equalization filter is computed by the test and measurement instrument based on the measured S-parameters read from the probe. To create an even more refined equalization filter, the S-parameters of the test and measurement instrument and/or the test point of the DUT may be used. Although S-parameters are described above for calculating the equalization filter, as will be readily understood by one skilled in the art, other parameters may be used that characterize the probe, oscilloscope and/or the DUT test point, such as T-parameters.

Although the embodiments illustrated and described above show the disclosed technology being used in an oscilloscope, it will be appreciated that embodiments of the present invention may also be used advantageously in any kind of test and measurement instrument that displays frequency domain signals, such as a swept spectrum analyzer, a signal analyzer, a vector signal analyzer, a real-time spectrum analyzer, and the like.

In various embodiments, components of the invention may be implemented in hardware, software, or a combination of the two, and may comprise a general purpose microprocessor, a digital signal processor (DSP), an application specific integrated circuit (ASIC), a field-programmable gate array (FPGA), or the like.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A test and measurement system, comprising:
a test and measurement instrument;
a probe connected to the test and measurement instrument and connectable to a device under test;
at least one memory configured to store parameters for characterizing the probe;
a user interface configured to receive a particular nominal source impedance value of the device under test; and
a processor configured to receive the parameters for characterizing the probe from the memory and the nominal source impedance value of the device under test from the user interface, and to calculate an equalization filter using the parameters for characterizing the probe from the memory and the nominal source impedance value from the user interface.

2. The test and measurement system of claim 1,
wherein the at least one memory is further configured to store parameters for characterizing the test and measurement instrument; and
the processor is further configured to receive the parameters for characterizing the test and measurement instrument and to calculate the equalization filter using the parameters for characterizing the test and measurement instrument.

3. The test and measurement system of claim 1, wherein the parameters for characterizing the probe are S-parameters.

4. The test and measurement system of claim 1, wherein the parameters for characterizing the probe are T-parameters.

5. The test and measurement system of claim 2, wherein the parameters for characterizing the probe and the test and measurement instrument are S-parameters.

6. The test and measurement system of claim 2, wherein the parameters for characterizing the probe and the test and measurement instrument are T-parameters.

7. The test and measurement system of claim 1, wherein the user interface is configured to receive a nominal source real impedance.

8. The test and measurement system of claim 1, wherein the user interface is configured to receive a nominal source complex impedance.

9. The test and measurement system of claim 1,
wherein the user interface is further configured to receive parameters characterizing a test point of the device under test; and
wherein the processor is further configured to receive the parameters for characterizing the test point of the device under test and to calculate the equalization filter using the parameters for characterizing the test point of the device under test.

10. The test and measurement system of claim 1, wherein the user interface is further configured to allow a user to turn on a nominal equalization view.

11. The test and measurement system of claim 1, wherein the user interface is further configured to allow a user to select a function to use a probe load filter.

12. The test and measurement system of claim 1, further comprising a display device configured to display a waveform modified by the equalization filter representing a signal received from the device under test.

13. A method for calculating an equalization filter for use in a test and measurement system, comprising:
receiving at a processor parameters for characterizing a probe of the test and measurement system;
receiving at the processor via a user interface a particular nominal source impedance value of a device under test; and
computing an equalization filter adapted to compensate for loading of the device under test caused by measurement of the device under test, the equalization filter computed by the processor based on the received parameters for characterizing the probe and the received nominal source impedance value of the device under test.

14. The method of claim 12, wherein the parameters for characterizing the probe are S-parameters.

15. The method of claim 12, wherein the parameters for characterizing the probe are T-parameters.

* * * * *